United States Patent
Chartier et al.

(10) Patent No.: US 8,647,465 B2
(45) Date of Patent: Feb. 11, 2014

(54) METHOD OF BONDING MICROSTRUCTURED SUBSTRATES

(75) Inventors: Isabelle Chartier, Grenoble (FR); Cécile Bory, Le Fontanil (FR); Patrick Pouteau, Meylan (FR)

(73) Assignees: Commissariat a l'Energie Atomique, Paris (FR); Biomerieux S.A., Marcy l'Etoile (FR)

(*) Notice: Subject to any disclaimer, the term of this patent is extended or adjusted under 35 U.S.C. 154(b) by 615 days.

(21) Appl. No.: 10/560,405

(22) PCT Filed: Jun. 14, 2004

(86) PCT No.: PCT/FR2004/050274
§ 371 (c)(1), (2), (4) Date: Dec. 12, 2005

(87) PCT Pub. No.: WO2004/112961
PCT Pub. Date: Dec. 29, 2004

(65) Prior Publication Data
US 2006/0124230 A1 Jun. 15, 2006

(30) Foreign Application Priority Data
Jun. 16, 2003 (FR) ........................................ 03 50218

(51) Int. Cl.
 *B32B 37/00* (2006.01)
 *B29C 65/00* (2006.01)

(52) U.S. Cl.
 USPC ........................... 156/292; 156/291; 427/282

(58) Field of Classification Search
 USPC ................... 427/282; 156/290, 291, 292, 277
 See application file for complete search history.

(56) References Cited

U.S. PATENT DOCUMENTS

| | | | |
|---|---|---|---|
| 5,842,787 A | 12/1998 | Kopf-Sill et al. | |
| 5,932,315 A * | 8/1999 | Lum et al. | 428/172 |
| 6,176,962 B1 * | 1/2001 | Soane et al. | 156/292 |
| 6,251,219 B1 * | 6/2001 | Chen et al. | 156/556 |
| 2003/0017305 A1 * | 1/2003 | Roitman et al. | 428/156 |

(Continued)

FOREIGN PATENT DOCUMENTS

| | | | |
|---|---|---|---|
| JP | 2000071422 A * | 3/2000 | |
| JP | 2000-246092 | 9/2000 | |

(Continued)

OTHER PUBLICATIONS

Awatani, Yoshio, et al.; "Damage Free Dicing Method for MEMS Devices"; Internat'l Conference on Optical MEMS, Conference Digest; Aug. 2002; pp. 137-138.

(Continued)

*Primary Examiner* — John Goff
(74) *Attorney, Agent, or Firm* — Nixon Peabody LLP

(57) ABSTRACT

Gluing process for micro-structured substrates. The invention is applicable particularly to the fabrication of micro-fluidic components. In order to glue a micro-structured substrate having upper coplanar plane areas and recesses between them, a grid is placed above the substrate, the grid is coated with a glue, using a tool that presses on the grid and locally brings it into contact with the areas, so as to deposit a film of glue droplets on them, and the grid is removed. Furthermore, the upper coplanar plane areas are treated before the film of glue droplets is deposited, this treatment being designed to adapt wettability of these areas to the glue.

16 Claims, 2 Drawing Sheets

(56) References Cited

U.S. PATENT DOCUMENTS

| | | | |
|---|---|---|---|
| 2003/0148065 A1* | 8/2003 | Kurtz | 428/137 |
| 2004/0020595 A1* | 2/2004 | Khan et al. | 156/275.5 |
| 2005/0077175 A1* | 4/2005 | Eisenbeiss et al. | 204/400 |
| 2005/0173059 A1* | 8/2005 | Ringleben et al. | 156/291 |

FOREIGN PATENT DOCUMENTS

| | | |
|---|---|---|
| WO | 99/18422 | 4/1999 |
| WO | 99/56954 | 11/1999 |
| WO | 00/77509 | 12/2000 |

OTHER PUBLICATIONS

Sasaki, Seimi, et al.; "Screen Printed Adhesive Technologies for All-Silicon Optical Packaging"; 1996 Electronic Components and Technology Conference;as early as Jan. 1996; pp. 1289-1293.

Huang, Tiemin, et al.; "Microfabrication of Microfluidic Cartridge for Isoelectric Focusing by Screen Printing"; Sensors and Materials, vol. 14, No. 3; Oct. 2001; pp. 141-149.

International Search Report; Oct. 26, 2004; 2 pp.

* cited by examiner

METHOD OF BONDING MICROSTRUCTURED SUBSTRATES

CROSS-REFERENCE TO RELATED APPLICATION

This application claims priority based on International Patent Application No. PCT/FR2004/050274, entitled "Method of Bonding Microstructured Substrates" by Isabelle Chartier, Cecile Bory and Patrick Pouteau, which claims priority of French Application No. 03/50218, filed on Jun. 16, 2003, and which was not published in English.

TECHNICAL DOMAIN

This invention relates to a process for gluing micro-structured substrates.

It is particularly applicable to the micro-system field which requires the assembly of micro-structured substrates comprising cavities or patterns with very small dimensions, for example less than 50 micrometers.

The invention is particularly applicable to the fabrication of micro-structures such as labs-on-chips and biochips that will be used in the biology field and that have surfaces provided with biological probes, for example DNA or protein probes, that are designed to react with samples to be analysed.

The invention is also applicable to the fabrication of micro-fluidic structures and more particularly to the fabrication of labs-on-chips in the biology field, but also to the fabrication of fuel micro-cells of heat exchangers, of MEMS (Mechanical Electrical Micro Systems) and of MOEMS (Mechanical Opto-Electrical Micro Systems).

STATE OF PRIOR ART

The use of micro-fluidic components such as labs-on-chips for biological applications provides a way of integrating means of implementing all or some steps of a biological protocol into a single component.

Thus, for example means of preparing a sample and means of obtaining biological reactions such as hybridisation, separation and detection can be integrated into this component, unlike biochips that are planar components comprising biological probes onto which a previously prepared sample is placed.

The fabrication of micro-fluidic components usually includes a step for the formation of micro-fluidic cavities (channels, chambers or reservoirs) in a substrate, followed by an assembly step to close and seal these cavities with another substrate or cap.

The width of the micro-fluidic cavities typically varies from 10 µm to several millimeters, while their depth typically varies between 10 µm and 500 µm.

The formation step of these cavities may include different techniques depending on the nature of the substrate in which they are formed. For example, you can use:
 a chemical or ionic etching with silicon,
 a chemical etching or machining by ultrasound or by laser with glass, and
 replication by injection, hot stamping or pouring from moulds containing the required pattern, mechanical machining, laser ablation or laser growth (stereopholithography) with polymers.

Lithography of positive or negative resins or of laminated photosensitive films can be used on a glass, silicon or polymer substrate.

Similarly, different assembly techniques are known and used depending on the materials used.

The difficulty with assembly of micro-fluidic structures lies in the small size of the patterns contained in them: spaces that are free (the size of which typically varies from 10 µm to 1 mm) must remain free; in particular, glue must not penetrate into them.

Furthermore, the closing process of micro-fluidic cavities must not destroy these cavities or modify their geometry.

It is also important that all surfaces that will come into contact with the closing substrate must be fixed to the closing substrate during the assembly step to prevent dead volumes that will hinder the planned circulation for the fluids and could trap bubbles or chemical species.

The following document contains information about the various techniques that can be used to close micro-fluidic components, as a function of the materials to be assembled:

[1] U.S. Pat. No. 5,842,787A (Kopf-Sill et al.).

In particular, known techniques for the assembly of glass or silicon substrates make use of sealing at very high temperatures incompatible with the formation of biological probes on these substrates before they are assembled.

The following document contains information about the assembly of polymer substrates:

[2] WO 99/56954A (Caliper Technologies Corp.).

This document discloses thermal welding techniques. However, with these techniques, only a limited number of materials capable of welding to each other can be used. Furthermore, the assemblies obtained do not have good resistance to thermal constraints and these techniques are not easily compatible with the placement of biological probes on the surfaces to be assembled.

Other known techniques use syringes to deposit glue automatically. However, these techniques are not suitable for the assembly of structures containing very thin patterns of the order of 50 µm to 100 µm or less.

Glue has to be deposited as far as the edge of the patterns to prevent any dead volume and trapping of the air bubbles, while assuring that glue does not flow in the cavities provided on these structures with the risk of closing them off or changing their volume.

Currently used gluing techniques are not compatible with the biological species deposited, or they are not sufficiently precise for micro-fluidic structures.

Therefore when a micro-fluidic component is to be provided with biological probes, it is preferable to form the probes using a solution once the component has been assembled. The probes are then formed on all of the component surfaces, which may in some cases be a disadvantage for optical detection.

Furthermore, such a technique makes it impossible to graft multiple probes in the same component or to geometrically locate the areas on which probes are installed, although this is possible in the case of open planar components such as biochips.

Logic controllers are also known to form dot matrices provided with different biological probes, but these logic controllers project drops and therefore cannot be used except on free surfaces. Consequently, they can no longer be used after the micro-fluidic component has been closed.

Contact coating techniques are also known such as coating using a roller and pad printing, to transfer a coherent film onto a substrate.

The following document contains information about this subject:

[3] WO 00/77509A (Merck Patent Gmbh et al.)

However, the resolution of these known coating techniques is too low, particularly for gluing micro-structured substrates to be used for the fabrication of micro-fluidic components, for example such as labs-on-chips.

More precisely, the use of such techniques does not enable the surface of a very small cavity to separate the coherent (in other words continuous) film of glue from its transfer means (roller or pad), with the result that this cavity is completely covered with this glue film.

PRESENTATION OF THE INVENTION

The purpose of this invention is to overcome the disadvantages mentioned above.

Specifically, the purpose of the invention is a process for gluing at least one micro-structured substrate comprising upper coplanar plane areas and recesses between them, by means of a glue that can bond to these upper coplanar plane areas, this process being characterised in that it comprises the following steps:

a grid is placed above the substrate, this grid is coated with glue using a tool which presses on the grid and locally brings this grid into contact with the upper coplanar plane areas, so as to deposit a film of glue droplets on these upper coplanar plane areas, and the grid is removed, process in which the upper coplanar plane areas are treated before the film of glue droplets is deposited on it, this treatment being designed to adapt the wettability of these areas to the glue.

Thus, in order to have a more precise definition of the glue deposit, it is proposed to deposit a film of glue droplets through the grid using a tool, and these droplets will join together to form a coherent glue film (in other words a continuous glue film) on the surfaces to be glued.

The resolution is thus improved because in a way it is defined by the size of the droplets.

The size of the holes in the grid, the pitch and the height of this grid and the wettability of the surfaces of the grid and of the plane areas of the substrate will be adapted so as to obtain the best possible result.

The tool used in the invention is preferably a doctor blade.

According to one particular embodiment of the invention, this treatment is designed to control spreading of glue droplets on the upper coplanar plane areas.

The invention also relates to a gluing process in which, after the glue has been deposited on the upper coplanar plane areas according to the invention, the micro-structured substrate is closed with a closing substrate that is fixed to the upper coplanar plane areas by the glue deposited on them.

Recesses in the micro-structured substrate may comprise areas which are provided with biological probes.

The closing substrate may comprise areas provided with biological probes, these areas being designed to be positioned facing the recesses in the micro-structured substrate after this micro-structured substrate has been closed.

The material that can be introduced both into the micro-structured substrate and into the closing substrate may be biological or non-biological, and in dry or wet form.

Furthermore, the closing substrate may comprise drillings through which a fluid will be added into the recesses in the micro-structured substrate.

According to a first particular embodiment of the process according to the invention, a set of micro-structured substrates are collectively fabricated in advance on the same substrate, the upper plane areas of all the micro-structured substrates being coplanar, a film of glue droplets is deposited collectively on all of these upper plane areas, all of the micro-structured substrates are closed by the same closing substrate and the micro-structured substrates thus closed are separated from each other.

According to a second particular embodiment, a set of micro-structured substrates are collectively fabricated in advance on the same substrate, the upper plane areas of all the micro-structured substrates being coplanar, and a set of closing substrates are fabricated collectively on another substrate, also in advance, the micro-structured substrates and the closing substrates are separated from each other and the micro-structured substrates are closed by the closing substrates after depositing a film of glue droplets on the upper coplanar plane areas of each micro-structured substrate.

Each substrate may be made from a material chosen from among glass, silicon and polymers.

BRIEF DESCRIPTION OF THE DRAWINGS

This invention will be better understood after reading the description of example embodiments given below simply for information purposes and in no way restrictive, with reference to the attached drawings in which.

DETAILED PRESENTATION OF PARTICULAR EMBODIMENTS

Given a micro-fluidic component containing micro-machined structures or micro-cavities with very small dimensions (about 5 µm to 50 µm), the invention can be used to close such a component without changing the shape, without creating any dead volume and without closing off the micro-cavities, possibly having previously formed a matrix of biological probes on the substrate that will close the component or in the recesses of the component (micro-structured substrate).

According to the invention, this is done using a screen printing technique to coat the substrate containing micro-cavities with glue.

Unlike the way in which it is usually used, limited to the definition of large patterns (at least 300 µm), screen printing is used in the invention with no mask, and due to control of the substrate surface energy it can be used to achieve a coating perfectly conforming with the micro-patterns formed in the substrate, without closing off even the finest of these micro-patterns.

Unlike other contact coating techniques (for example such as pad printing or coating by roller) which transfer a coherent film onto a substrate (see document [3] mentioned above), the invention is used firstly to obtain an array of micro-drops deposited by contact using screen printing onto the upper coplanar parts of the substrate.

These micro-drops subsequently joined together, provided that the wettability of the glue on the substrate is well adapted—they are "drawn" by the surface energy of the substrate—to form a coherent (in other words continuous) film perfectly conforming with the micro-structures of the substrate.

Figure 1A:
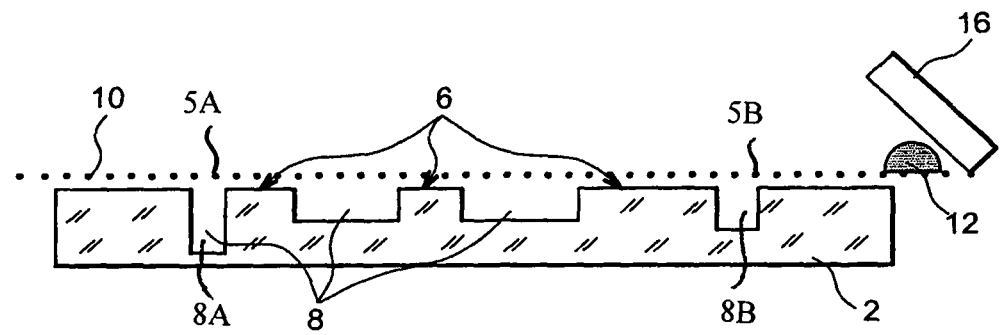
FIGS. 1A to 1C diagrammatically illustrate the steps in one particular embodiment of the process according to the invention, FIGS. 2A and 2B diagrammatically illustrate the formation of an array of glue micro-droplets and then the formation of a coherent glue film according to the invention, and FIG. 3 diagrammatically illustrates closing of a micro-structured substrate by a cap according to the invention.
Figure 1B:
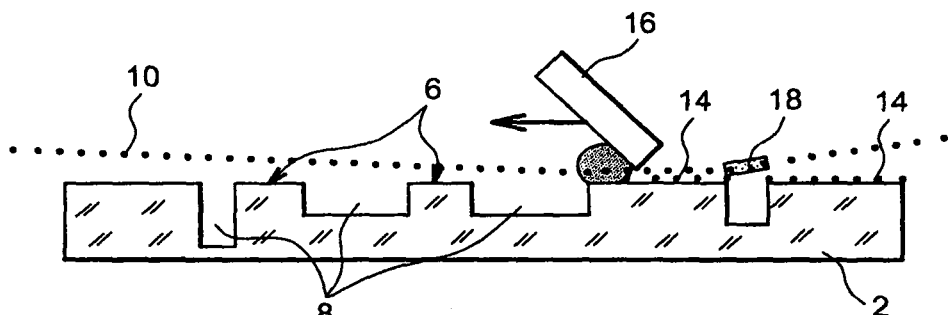
Figure 1C:
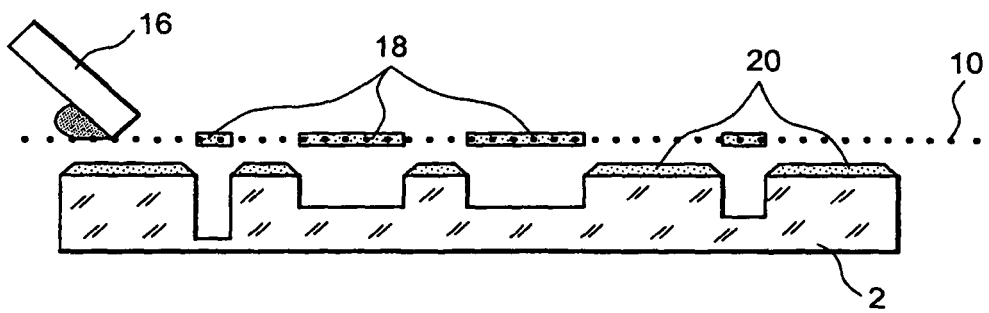

One example of the process according to the invention is diagrammatically illustrated in FIGS. 1A to 1C and is used to coat a micro-structured substrate 2 with glue by screen printing in two phases, namely (a) deposit an array of glue micro-drops and (b) form a coherent glue film conforming with the structures of the substrate.

FIG. 1A shows the micro-structured substrate 2 comprising upper coplanar plane areas 6 and recesses 8 between these areas. These recesses form micro-cavities that will contain a fluid.

A grid 10 (with no mask) is put into place above the substrate and a volume 12 of glue capable of bonding to the areas 6 is placed at one end of this grid.

As shown in FIG. 1B, an array 14 of glue micro-drops is then deposited on the areas 6. This is done by coating the grid 10 with glue using a tool such as a doctor blade 16 that is displaced on the grid, and that presses on a top surface of the grid locally to bring an opposing bottom surface of the grid into contact with the areas 6 so as to form the array 14. Therefore the grid must be flexible, with a flexibility to be determined in advance.

As shown in FIGS. 1A-1C, the grid 10 has a plurality of holes which extend through the top and bottom surfaces, in which all of the holes are uniformly spaced from one another and have the same width dimensions. Also as expressly shown in FIGS. 1A-1C, the width dimensions of the holes are such that no hole is larger, along its width dimensions, than that of the smallest recess in the substrate. This is expressly shown in FIG. 1A with respect to hole 5A and recess 8A as well as hole 5B and recess 8B. In the areas 18 that are above the micro-cavities 8 there will still be glue on the grid that then can be removed.

FIG. 1C shows the formation of a continuous glue film 20 conforming with the areas 6 or reliefs, by spreading microdrops from the array 14 that has been deposited.

The advantage of coating in two phases according to the invention is to enable closure of very small micro-cavities for which the surface (for example in the case of pad printing or roller coating) would have been incapable of separating the transferred coherent glue film and would therefore have been covered by this glue film.

The transfer is done from the transfer support (for example a pad or a roller) to the substrate if the bond of the glue film on this substrate is greater than its bond on the transfer support.

We will now consider a cavity formed on the surface of the substrate and with a determined surface area measured parallel to this surface.

In the case of the transfer of a coherent glue film, the bond or the adhesion force of this film onto the transfer support corresponding to the determined surface area, must be greater than the surface tension of the glue film to cut this film at the edge of the cavity.

If this condition is satisfied while the surface area corresponding to the cavity remains sufficiently large, it will no longer be satisfied when this surface area becomes very small. The film then cannot be broken; it remains coherent and covers the cavity.

On the other hand with the invention, in the case of a transfer of a micro-drops array, the bond onto the transfer support (namely the grid) depends only on the surface area of the micro-drops that will only be deposited on the surfaces of the substrate in contact with the grid, so that very small cavities will not be covered.

Figure 2A:
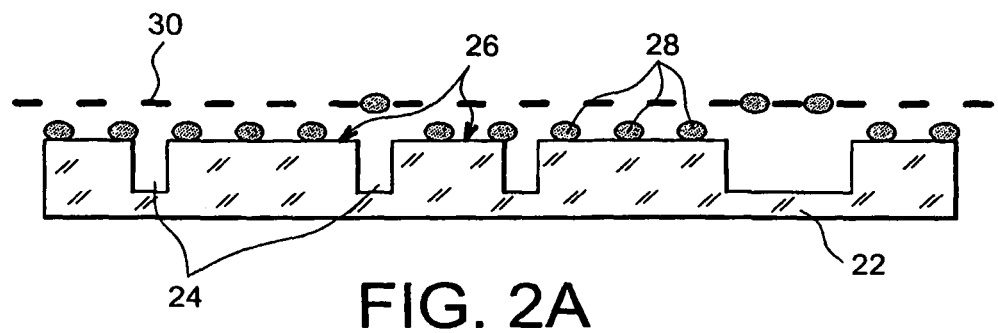

This is diagrammatically illustrated by FIG. 2A in which a micro-structured substrate 22 can be seen containing very small cavities 24.

An array of glue micro-droplets 28 deposited by screen printing using a grid 30 is transferred onto the upper surfaces 26 of the substrate. Glue does not penetrate into the cavities 24.

The size of the holes in the grid are such to ensure that the size of the micro-drops 28 is similar to the size of the smallest cavities.

Figure 2B:
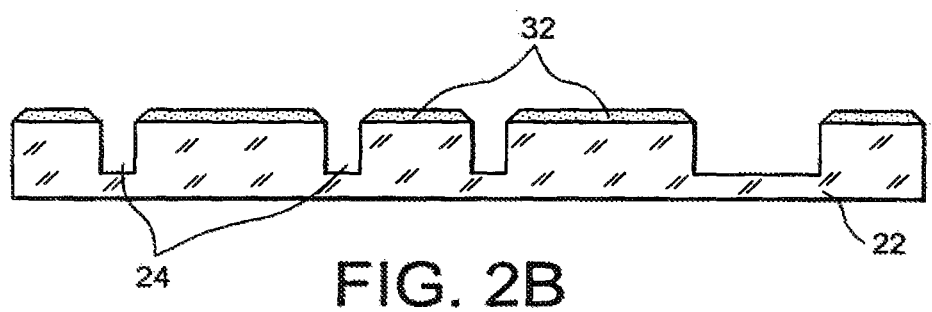

The micro-drops then group together to form continuous glue films 32 on the surface of the substrate (FIG. 2B).

The thickness of the formed glue film 4 is defined by the following parameters:

the volume of the micro-drops and the density of the deposited micro-drops array that are defined by the choice of the screen printing grid, the energy and surface tension of the coated support, the viscosity of the glue, and doctoring parameters, namely the material and hardness of the doctor blade, the doctoring velocity and force, and the distance between the grid and the substrate.

The size of the micro-drops is adapted to the smallest hollow pattern (cavity) present on the substrate.

Depending on the needs of users, the thickness of the glue film may be chosen to be between 0.1 µm and 100 µm.

Preferably, when at least one of the two substrates is provided with cavities whose size is smaller than 20 µm, the thickness of the film is between 0.5 µm and 2 µm.

The invention has the following advantages:

This invention enables the assembly of structured substrates comprising cavities with very small dimensions, less than 50 µm wide, without closing off or covering these cavities with a glue film.

The invention is a gluing technique that is compatible with the formation of multiple biological probes locally on the substrate(s) to be assembled before this assembly.

The use of the invention is compatible with a large number of glues with a variety of functional characteristics adapted to the use, for example behaviour at high temperature and the content introduced into the glues. For example, it would be possible to use silicon-based, acrylic, epoxy or cationic glues, glues which are polymerisable by heating, ultraviolet radiation or humidity, glues with one or two components.

The invention can be used for collective closure of chips on a semi-conducting wafer and forms a technique that can be very homogeneously adapted to any substrate size (screens larger than 1 m$^2$ are available for screen printing).

The invention can also be used for individual closure of components.

Micro-fluidic cavities may be formed by etching in a silicon substrate or a glass substrate, or by hot stamping, injection, plasma etching or laser etching from a polymer material, or using a layer of photosensitive resin.

The width of the channels in these micro-fluidic cavities will typically vary from 10 µm to 100 µm, while the width of the chambers and reservoirs of these cavities will typically vary from 2 mm to 10 µm, and the etching depth will vary from between 40 µm and 500 µm.

In one preferred embodiment, a surface preparation of the substrate is performed, for example using a plasma, an ultraviolet radiation, ozone, an HMDS treatment or a silanisation to adapt the wettability of the surface to the chosen glue. A hydrophobic or hydrophilic treatment may be chosen to control spreading of the micro-drops that will have been deposited.

The second substrate or cap that will close the cavities may for example be a silica, polymer or silicon wafer.

Glue is coated by screen printing, for example using a polyester, polyamide or steel fabric screen. A polyester screen will be used in preference, and in this case any type of glue including fluid polymers can be used, with one or two components and regardless of whether it is cross-linkable by ultraviolet radiation, heating or by air.

The glue (in the broad sense of the term, including fluid polymers) is adapted to the materials in the substrates to be assembled. These substrates may be made of different materials (hybrid gluing) such as glass, silicon, polymers and metals.

The glue may be chosen to adapt the characteristics of the seal to be formed (between the micro-structured substrate and the cap) to the usage constraints of the micro-fluidic component being fabricated: for example, it may be required to obtain a flexible or rigid, electrically or thermally conducting or insulating seal with a defined and controlled thickness (use of a glue containing spacers) and with defined optical properties (for example transparency or fluorescence) and with a thermal or chemical resistance.

The glues used must satisfy different selection criteria, mainly biological compatibility with probes that may be deposited on the cap and with liquid samples, the polymerisation mode that must not destroy biological probes (temperature less than 120° C. or insulation by ultraviolet radiation).

A wide range of viscosities can be used for the glue, for example varying from 3000 mPa·s (very liquid state) to 50000 mPa·s (pasty state).

According to the invention, the coating is applied on the structured substrate and the screen printing screen will not include patterns to define glue deposition areas (unlike what happens with a stencil).

Glue is then deposited only on the upper coplanar structures that come into contact with this glue during doctoring. Thus, glue is not deposited at the bottom of micro-fluidic cavities (channels, chambers or reservoirs).

In one example, the substrate is placed under the screen printing screen at a distance of between 0.5 mm and 2 mm without being aligned; a strip of glue is deposited on the screen, the length of this strip being equal to or slightly greater than the width of the substrate; the glue is then compressed using a hard gum doctor blade, applying a linear displacement over the entire length of the substrate.

The thickness of the glue film deposited on the substrate is defined by the screen printing screen type (material, number of wires/cm, the wire diameter and mesh size), the nature of the glue used (viscosity, surface tension) and the substrate material (for example silicon or polymer).

In some cases, it may be desirable to define a coarse stencil, for which the pattern sizes are very much greater than the sizes of the micro-fluidic structures, to avoid depositing non-useful glue over large areas (for example to be able to cut around the substrate or to define cutting paths) This coarse stencil does not add any precise alignment step.

The cap (closing substrate) is then deposited on the glued structured substrate using either a mechanical alignment (using a mechanical part that guides the two substrates) or an optical alignment (using a micro-electronic "wafer bonding" or "mask aligner" type micro-electronic positioning machine) so as to position the areas on which biological probes are installed facing the micro-fluidic chambers.

A pressure is then applied between the two substrates thus aligned. Preferably, a slight vacuum is created between these two substrates so as to eliminate possible air bubbles that would reduce the leak tightness of the glue joint.

The glue is then polymerised using a process adapted to this glue. A thermal polymerisation in a drying oven and/or insolation by ultraviolet radiation may be used.

Figure 3:
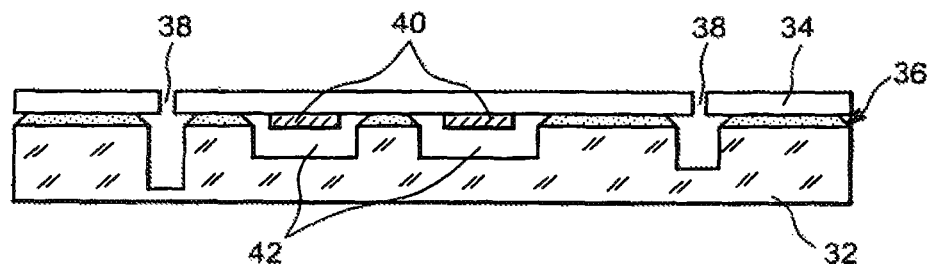

FIG. 3 shows a diagrammatic view of a micro-structured substrate 32 closed by a cap 34. This cap is fixed to the substrate by a glue film 36 that is formed on the substrate according to the invention.

The cap 34 may or may not include openings 38 for the injection of fluids.

It can also be seen that the cap is provided with an array of biological probes 40 facing cavities 42 on the substrate 32.

This invention can be used for collectively closing fluidic chips. These chips may be formed collectively on a silicon, glass or polymer substrate and comprise areas forming reservoirs or channels that may for example be obtained by a photolithography step of a thick resin, for example resin marketed as reference SU8.

Glue is deposited according to the invention by screen printing with no mask, on the areas provided for this purpose on the set of chips. This set of chips is then collectively closed by a cap made of plastic, glass or silicon that is placed on areas on which glue is provided.

The substrate and the cap may be aligned mechanically, using a mechanical pre-positioning part, or optically using a micro-electronic positioning machine of the type used to fix two silicon wafers to each other.

After the cap has been positioned on the substrate provided with glue, the cap is forced into contact with this substrate if necessary, by applying a vacuum to the substrate on which the cap is fitted.

The assembly formed by the structured wafer, glue and the collective closing cap is then cut into individual chips.

In one preferred embodiment of the invention, biological probe studs are formed on the cap before assembly, which enables the use of a spotting robot (for example like those marketed by the Karl Suss Company) and therefore the formation of a matrix of pointlike probes which could be all different, so as to simultaneously do hybridisation and a multi-criteria analysis of the same liquid sample in the same component.

Areas forming matrices of biological probes are arranged so that they will face the cavities (chambers) in the structured substrate after assembly.

If necessary, openings are drilled in the cap as described to enable the injection of liquid samples into the fluidic circuit of the component formed.

In one example, the structured substrate comprises narrowed areas (baffles) with a width of typically 20 μm and that are capable of isolating two adjacent fluidic chambers.

Formation of the assembly according to the invention will not deteriorate the deposited biological probes and will not close off or cover narrowed areas.

The assembly may be made collectively on the set of components etched on a 100 mm diameter substrate, but the screen printing technique provides a means of working on substrates having a much larger size (diameters greater than or equal to 200 mm) because the size of the grids is not limited.

Different types of glues (particularly polymer resins) capable of forming joints may be used in the invention, for example:

a flexible epoxy glue (for example of the type commercially available under the reference Duopox 1891), a cationic glue (for example of the type commercially available under the reference Delo Katiobond 45952), a silicone glue (for example of the type commercially available under the reference Toshiba GE TSE 399 or TSE 397), a silicone glue (for example of the type commercially available under the Dow Corning reference DC866), a PDMS (for example of the type commercially available under the Dow Corning reference Sylgard 184).

In another particular embodiment of the invention, the structured substrate and the cap provided with biological probes are cut into chips before their assembly. The glue coating is still applied using the same screen printing principle but is then done chip by chip. Alignment and contact are achieved using a pick-and-place (transfer arm) type equipment, the glue is then polymerised depending on the manner in which it is used, by ultraviolet insolation, heating or drying in air.

In another particular embodiment, the micro-structured substrate is formed by a replication, injection or hot stamping technique in a polymer (for example PMMA, COC, Polycarbonate, TPX, PMMI), or by lithography of a thick photosensitive resin (for example of the type marketed under the reference EPON, SU8 or MicroChem) on a substrate that may for example be made on silicon, glass, quartz or silica. The overall process is then the same.

The invention claimed is:

1. Process for assembling at least one micro-structured substrate comprising upper coplanar plane areas and recesses between them, by means of a glue that can bond to these upper coplanar plane areas, this process being characterised in that it comprises the following steps:
    placing a mask-less grid above the substrate, the mask-less grid having a plurality of uniformly spaced holes extending between a top side and a bottom side of the grid, each of the uniformly spaced holes configured to accept a portion of glue having a dimension substantially equal to a width dimension of a smallest recess in the substrate and wherein a pre-determined portion of the grid including at least one hole is aligned over a recess in the substrate;
    coating the top side of the grid with glue; and
    pressing a tool on the top side of the grid to locally bring the bottom side of the grid into contact with the substrate, wherein glue passing through the holes only deposit on the upper coplanar plane area without said glue entering into said recesses.

2. Process according to claim 1, in which the tool is a doctor blade.

3. Process according to claim 1, in which the micro-structured substrate is closed with a closing substrate that is fixed to the upper coplanar plane areas by the glue deposited on them.

4. Process according to claim 3, in which recesses in the micro-structured substrate comprise areas which are provided with biological probes.

5. Process according to claim 3, in which the closing substrate comprises areas provided with biological probes, these areas being designed to be positioned facing the recesses in the micro-structured substrate after this micro-structured substrate has been closed.

6. Process according to claim 3, in which the closing substrate comprises drillings through which a fluid will be added into the recesses in the micro-structured substrate.

7. Process according to claim 3, in which a set of micro-structured substrates are collectively fabricated in advance on the same substrate, the upper plane areas of all the micro-structured substrates being coplanar, a film of glue droplets is deposited collectively on all of these upper plane areas, all of the micro-structured substrates are closed by the same closing substrate and the micro-structured substrates thus closed are separated from each other.

8. Process according to claim 3, in which a set of micro-structured substrates are collectively fabricated in advance on the same substrate, the upper plane areas of all the micro-structured substrates being coplanar, and a set of closing substrates is fabricated collectively on another substrate, also in advance, the micro-structured substrates and the closing substrates are separated from each other and the micro-structured substrates are closed by the closing substrates after depositing a film of glue droplets on the upper coplanar plane areas of each micro-structured substrate.

9. Process according to claim 3, in which each substrate is made from a material chosen from among one or more of glass, silicon or polymers.

10. Process according to claim 1, in which at least one recess has a width dimension equal to or less than 100 μm.

11. A method for assembling at least one micro-structured substrate having upper coplanar plane areas and recesses adjacent to the upper coplanar plane area, the method comprising:
    increasing wettability of the upper coplanar plane areas to accept glue thereon;
    placing a mask-less grid above the substrate, the grid having a plurality of uniformly spaced holes of same width dimension, the holes extending between a top side and a bottom side of the grid, each of the width dimensions at least substantially equal to a corresponding width dimension of a smallest recess in the substrate and wherein a pre-determined portion of the grid including at least one hole is aligned over a recess in the substrate;
    placing glue on the top side of the grid;
    pressing downward on the top side of the grid such that the bottom side comes locally into contact with the substrate such that glue is deposited only on the upper coplanar plane areas; and
    removing the grid from the upper coplanar plane areas, wherein the glue does not enter any of the recesses.

12. Method according to claim 11, in which at least one recess has a width dimension equal to or less than 100 μm.

13. Process according to claim 1 further comprising treating the coplanar plane areas to obtain a desired wettability of the coplanar plane areas of the substrate.

14. Process according to claim 13, in which this treatment is designed to control spreading of glue droplets on the upper coplanar plane areas.

15. Process according to claim 1, wherein the glue applied is in the form of an array of glue micro-drops.

16. Process according to claim 1, wherein a predetermined portion of the grid is not aligned with the recesses of the substrate when placed above the substrate.

* * * * *

UNITED STATES PATENT AND TRADEMARK OFFICE
CERTIFICATE OF CORRECTION

PATENT NO. : 8,647,465 B2
APPLICATION NO. : 10/560405
DATED : February 11, 2014
INVENTOR(S) : Chartier et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 633 days.

Signed and Sealed this
Twenty-ninth Day of September, 2015

Michelle K. Lee
*Director of the United States Patent and Trademark Office*